US006759842B2

(12) United States Patent
Weimer

(10) Patent No.: US 6,759,842 B2
(45) Date of Patent: Jul. 6, 2004

(54) INTERFACE ADAPTER FOR AUTOMATIC TEST SYSTEMS

(75) Inventor: Jack Edward Weimer, Grayslake, IL (US)

(73) Assignee: Eagle Test Systems, Inc., Mundelein, IL (US)

( * ) Notice: Subject to any disclaimer, the term of this patent is extended or adjusted under 35 U.S.C. 154(b) by 0 days.

(21) Appl. No.: 10/125,725

(22) Filed: Apr. 17, 2002

(65) Prior Publication Data

US 2003/0197521 A1 Oct. 23, 2003

(51) Int. Cl.[7] .................... G01R 1/04; G01R 31/02
(52) U.S. Cl. ....................... 324/158.1; 324/754
(58) Field of Search ................. 324/158.1, 754–755, 324/760–765

(56) References Cited

U.S. PATENT DOCUMENTS 5,072,185 A * 12/1991 Rockwell ................. 324/539
5,672,981 A * 9/1997 Fehrman ................. 324/755
5,896,037 A * 4/1999 Kudla et al. ............. 324/755
6,069,482 A * 5/2000 Hilton ..................... 324/755
6,084,422 A * 7/2000 Bartholomew ........... 324/754
6,181,149 B1 * 1/2001 Godfrey et al. .......... 324/754
6,292,003 B1 * 9/2001 Fredrickson et al. ..... 324/754
6,437,586 B1 * 8/2002 Robinson ................. 324/755
6,462,570 B1 * 10/2002 Price et al. .............. 324/754
6,489,788 B2 * 12/2002 Sausen .................... 324/754

* cited by examiner

Primary Examiner—David A. Zarneke
Assistant Examiner—Jermele Hollington
(74) Attorney, Agent, or Firm—Greer, Burns & Crain, Ltd.

(57) ABSTRACT

A removable interface adapter includes a frame, a first set of contacts configured for connection to a first set of test head contacts in a test system, and a second set of contacts configured for connection to a test board having at least one device to be tested. The first and second adapter contacts are interconnected so that electronic devices placed in the test board can be tested by the test system. With this adapter, test boards made for one test system can be used on other test systems.

15 Claims, 5 Drawing Sheets

INTERFACE ADAPTER FOR AUTOMATIC TEST SYSTEMS

This invention relates to automatic test systems, and more particularly, to interface adapters for automatic test systems that allow test boards designed for one test system to be used on different test systems.

BACKGROUND OF THE INVENTION

Automatic test systems are used by manufacturers of electronic devices such as voltage regulators, radio frequency circuit devices and other circuits, to test the devices before they are installed in an end product. The test systems can be configured to test a variety of devices under various test conditions, using a test head that has as many as 3,000 or more electrical terminals for connecting to and testing one or more devices under test (DUTs).

DUTs can be tested in an unpackaged condition on a semiconductor wafer, or in a packaged condition with leads attached and perhaps encapsulation completed. To test the packaged DUTs, a special board known as a DUT board is constructed. The board is especially designed to hold one or more DUTs, and to be easily installed on the test head. The board connects terminals or leads on the DUT(s) to the terminals in the test head. In this manner, one test system can be used for different devices, by designing a DUT board for each device.

Unpackaged DUTs are tested using a probe card that makes electrical contact with at least selected devices on the wafer. A probe interface ring connects a prober interface board (similar to a DUT board) to the probe card. The probe interface board and probe card are uniquely designed for testing a particular device on a particular test system.

Different test systems have different test heads to which DUT boards are secured, so DUT boards made for one test system usually cannot be used on a different test system, because the DUT boards do not fit the test head of the other test system. This limits the flexibility of a user having several test systems with different test heads, and can lower productivity. This is also a problem for users who want to purchase test systems having different test heads, particularly less expensive, smaller or better test systems, because new DUT boards must be made for each device, which is time-consuming, requires engineering resources, and is expensive.

Accordingly, one object of this invention is to provide new and improved interface adapters for automatic test systems.

Another object is to provide new and improved interface adapters for automatic test systems that allow DUT boards designed for one test system to be used on other test systems.

SUMMARY OF THE INVENTION

In keeping with one aspect of this invention, a removable interface adapter for automatic test systems having a test head includes a first set of contacts configured for electrical connection to first contacts in the test head, and a second set of contacts configured for electrical connection to a test board that includes or provides an interface to one or more devices to be tested. The first and second contacts are interconnected so that devices used with the test board can be tested through the test head. The interface adapter can be easily removed, however, for testing using DUT boards having different contact configurations.

BRIEF DESCRIPTION OF THE DRAWINGS

The above mentioned and other features of this invention and the manner of obtaining them will become more apparent, and the invention itself will be best understood by reference to the following description of an embodiment of the invention taken in conjunction with the accompanying drawings, in which.

DETAILED DESCRIPTION

Figure 1:
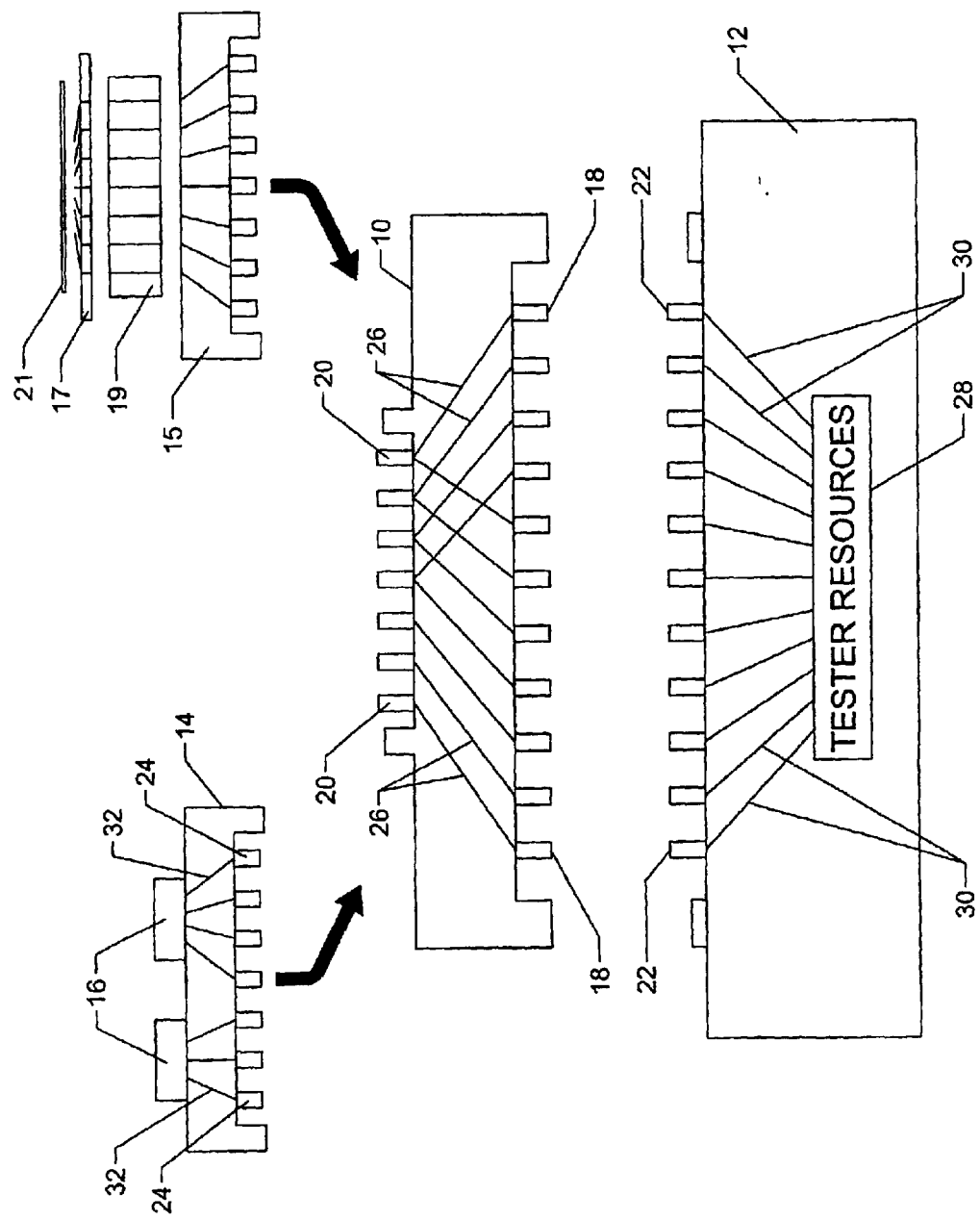
FIG. 1 is a diagram of automatic test equipment including an interface adapter made according to the present invention.

As seen in FIG. 1, an automatic test system includes an interface adapter 10, with test head 12 and a device under test (DUT) board 14 or a prober interface board 15, a probe card 17 and a prober interface ring 19. The DUT board 14 includes one or more packaged devices under test (DUT) 16 which are inserted in sockets (not shown) in the DUT board 14 for testing purposes and removed after testing. Unpackaged devices in a wafer 21 are tested using the prober interface board 15 and related components. For ease of explanation, the invention will now be described by referring to the DUT board 14, with the understanding that it is interchangeable with the prober interface board 15 and related components.

On one side, the adapter 10 is electrically connected to the test head 12 by a plurality of contacts 18. On the other side, the adapter 10 is connected to the DUT board 14 through a plurality of contacts 20, which can be any suitable connectors. The contacts 18 are configured to make electrical connections to a plurality of contacts 22 in the test head 12, and the contacts 20 are configured, usually in a different arrangement, to make electrical connection with contacts 24 in the DUT board 14. The contacts 18 are connected to the contacts 20 by a series of conductors 26.

The test head 12 includes test circuits 28 that produce various inputs to the DUTs 16, and measure various outputs of the DUTs 16 and perhaps other parameters, to test the performance of the DUTs 16. The test circuits 28 are connected to the contacts 22 through a series of conductors 30. The contacts 24 in the DUT board 14 are connected to appropriate terminals of the DUTs 16 through a plurality of conductors 32.

Figure 2:
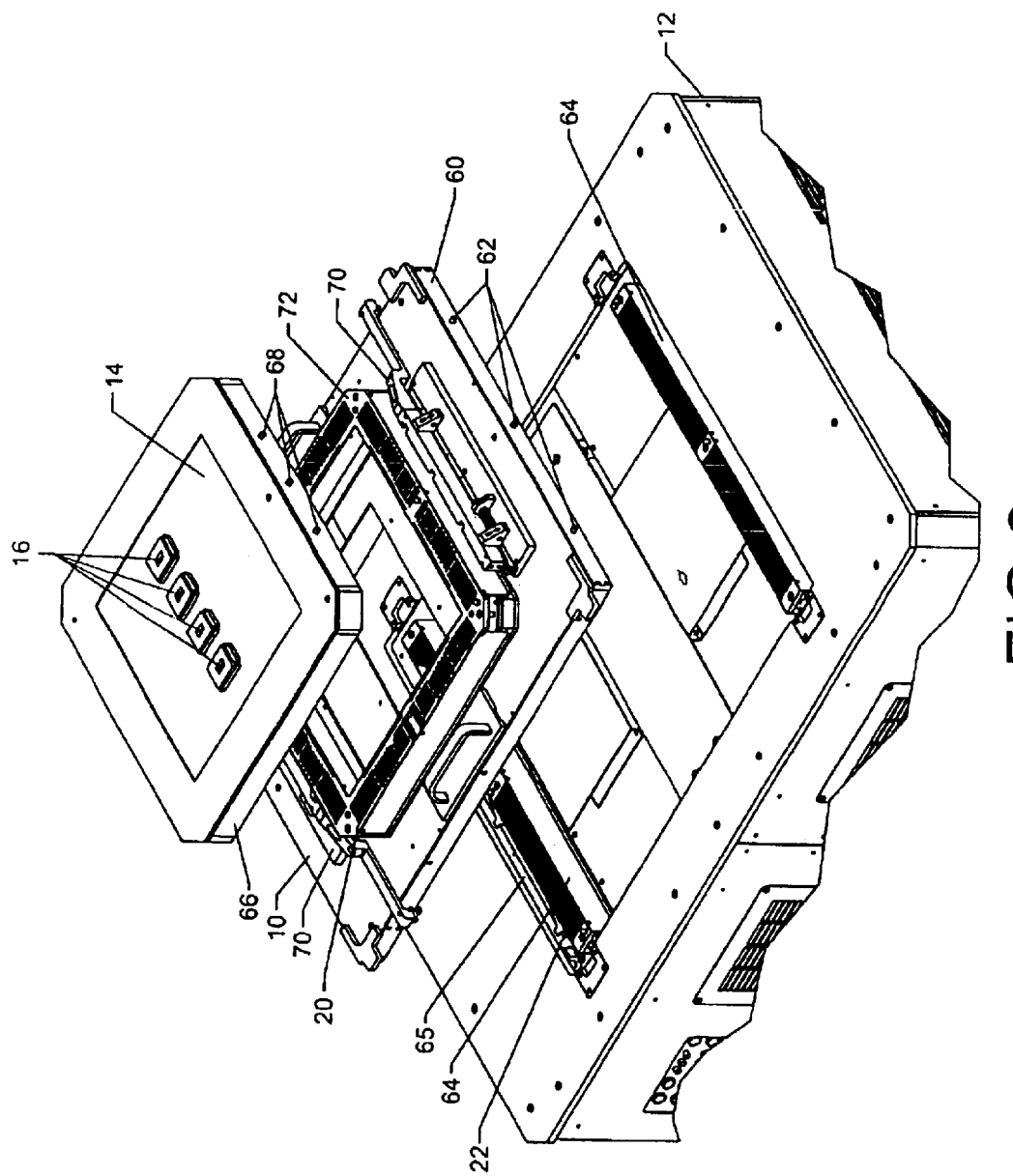
FIG. 2 is a perspective view of test equipment made according to one implementation of FIG. 1.

Referring now to FIG. 2, the contacts 20 and 22 are spring loaded pins that will be described. The pins 22 are shown in a generally two-sided linear configuration, although other configurations are contemplated. The pins 20 can have a different arrangement than the arrangement of the contacts 22, such as a rectangular, as shown, circular or some other arrangement.

The interface 10 allows the DUT board 14 to be used with the test head 12 by arranging the pins 20 to be complimentary to the contacts 24 (not seen in FIG. 2), arranging the pins 22 to be complimentary to the contacts 18 (also now seen in FIG. 2), and suitably interconnecting the contacts 18 to the pins 20. While the interface adapter 10 is particularly suitable for adapting one physical configuration to another, it could also be used to adapt one electrical configuration to another electrical configuration, even if the physical configurations were the same, by appropriately arranging the conductors 26 in the interface adapter 10.

Some DUT boards use more than 3,000 spring loaded pins to make the necessary connections to the test head. Because of the combined force created by so many pins, a suitably stable frame 60 is provided on the adapter 10, with a system for pulling the adapter 10 down to the test head 12. The frame 60 is typically made of metal, and includes a plurality of cam followers 62 that fit into cam surfaces (not identified in FIG. 2) in adapter board pull-down arms 65.

Cam followers 62 and pull-down arms 65 are provided on both the left and right sides of the adapter 10 to secure the frame 60 to the test head 12. In this manner, the adapter 10 can be quickly and easily removed or replaced on the test head 12.

The DUT board 14 typically has a frame 66 and cam followers 68. The adapter 10 has pull-down arms 70 having cam surfaces 63 (FIG. 3A) for securing the DUT board 14 to the adapter 10 in the manner just described. The pull-down arms 70 and 65 are similar in structure and operation.

Figure 3:
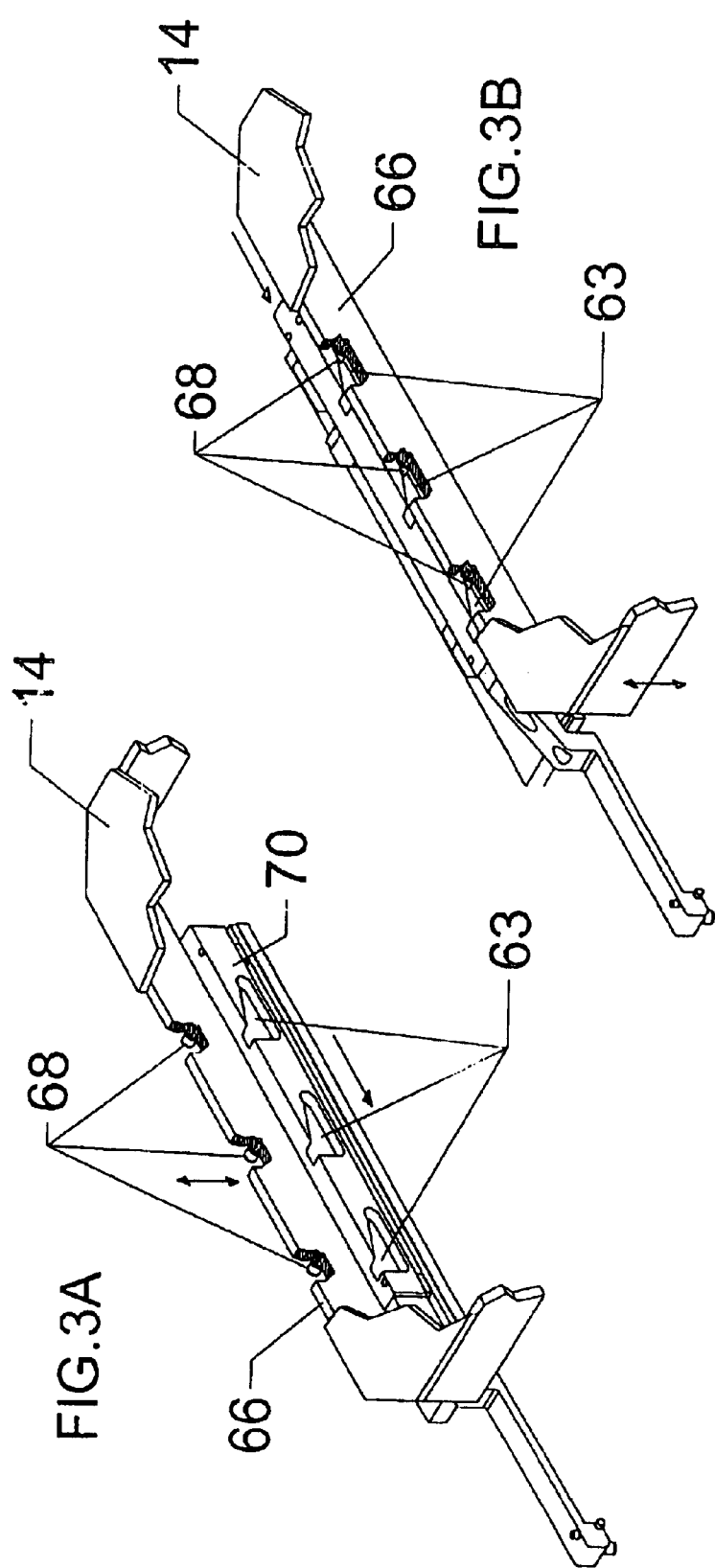
FIG. 3A is a perspective view of a pull-down arm (shown in partial cross-section) used in the test equipment of FIG. 2, shown with part of an unsecured DUT board.
FIG. 3B is a perspective view of the pull-down arm of FIG. 3A, shown with the DUT board secured.

The cam surfaces 63 are angled in the arms 70, as seen in FIG. 3A. As seen in FIG. 3B, lateral movement of the arms 70 in one direction pulls the DUT board 14 down to the adapter 10 for engagement of the pins 20 with the contacts 24. Lateral movement of the arms 70 in the other direction releases the DUT board 14 upwardly. The arms 70 and 65 can be moved pneumatically, if desired. The cam surfaces and cam followers for securing and releasing the adapter 10 to and from the test head 12 operate in a similar manner.

Figure 4:
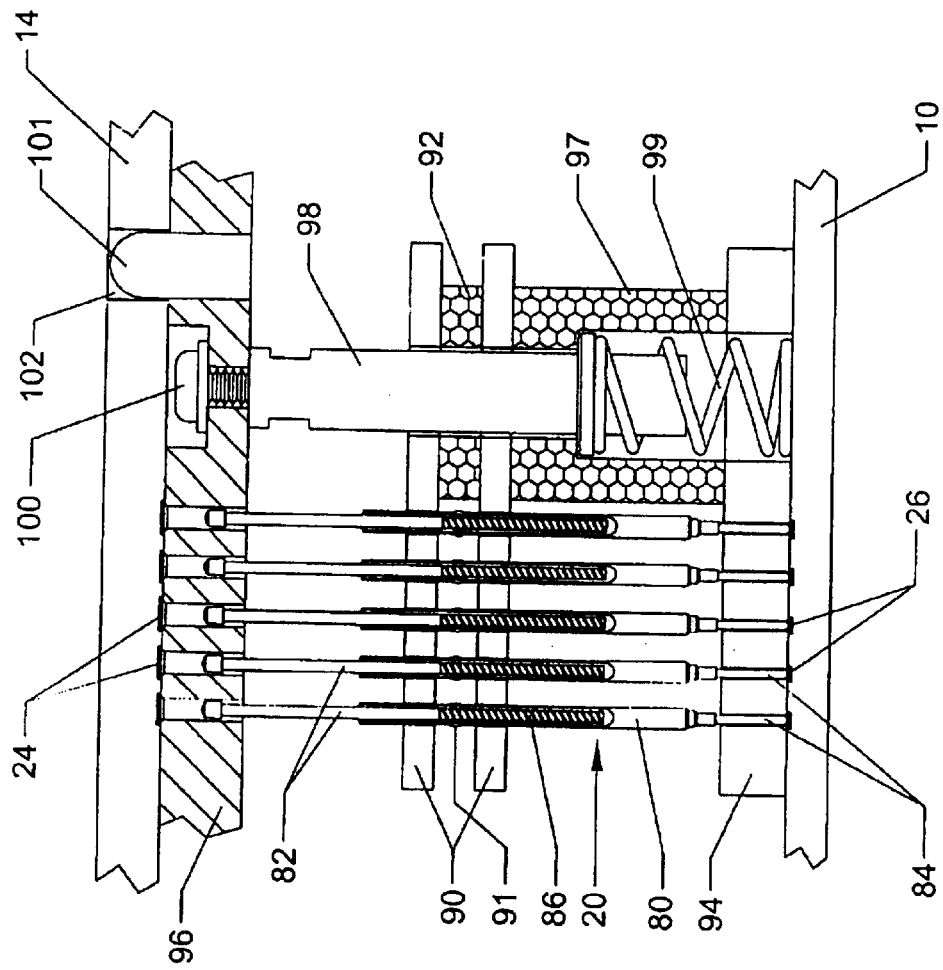
FIG. 4 is a diagram of a spring loaded pin that can be used with the test equipment of FIGS. 1 and 2.

Some of the pins 20 (which are similar to the pins 22) are shown in greater detail in FIG. 4. The pins 20 include a spring pin receptacle 80 having an internal cavity, spring probes 82 and pins 84. Both probes 82 and pins 84 could be spring loaded, but in FIG. 4 only the probes 82 are spring loaded within the receptacle 80 by a spring 86, and the pins 84 are fixed. Within each pin 20, the spring 86 is located in the receptacle cavity between the probe 82 and the pin 84, forcing the probe 82 out of the cavity. The pins 84 can make electrical contact with the conductors 26, if desired, and the probes 82 can make electrical contact with contacts 24 of the DUT board 14 in any suitable manner.

One way to assemble the pins 20 is in blocks 64 (FIG. 2), which hold the pins 20 in place while allowing the probes 82 and pins 84 to make contact with their respective contacts under pressure from the springs 86. The blocks 64 may be constructed in any suitable manner. In FIG. 4, the pins 20 are secured by two pin guides 90. The pin guides 90 are separated by a spacer 92.

The pins 20 can move axially within the pin guides 90, to the extent permitted by protrusions 91 on the sides of the pins 20. By allowing this movement, both the probes 82 and the pins 84 can be subjected to pressure from the spring 86 in use. The pin guides 90 are secured to a pin base 94 on the adapter 10, and the pins 84 are aligned with the contacts 26 by openings in the pin base 94.

A pin guard 96 is secured to the adapter 10. The pin guard 96 aligns the spring probes 82 and protects them from mechanical damage caused by bending and the like. The pin guard 96 also electrically insulates the probes 82 from each other.

One or more housings 97 are provided to secure and align the pin guides 90, and also house one or more plungers 98 biased by a spring 99. After installation of the pin guard 96 on the adapter 10, a screw 100 can be threaded into an appropriate opening in the plunger 98 to secure the pin guard. The pin guard 96 is biased upwardly, with downward movement limited by the bottom surface of the plunger 98. Alignment and electrical contact reliability can be further improved by providing alignment pins 101 in the pin guard 96, and alignment holes 102 in the DUT board 14.

The frame 60 (FIG. 2) is designed for attachment to the pull-down arms 65. The connectors 18 are arranged to make electrical contact with the pins 22 when the adapter 10 is installed on the test head, although it may not always be necessary to make connection to all of the pins 22. The DUT board 14 is similarly secured to the pull-down arms 70 on the interface adapter 10, the pins 20 making electrical connection with the contacts 24. Of course, the contacts 18 and pins 20 are interconnected through the conductors 26 in the manner needed to use a particular test board. In any event, when the interface adapter 10 is installed on the test head 12, all DUT boards 14 having a common contact configuration can be used. In this manner, many devices 16 can be easily tested on a variety of different test systems, without designing an array of DUT boards for each test system.

Figure 5:
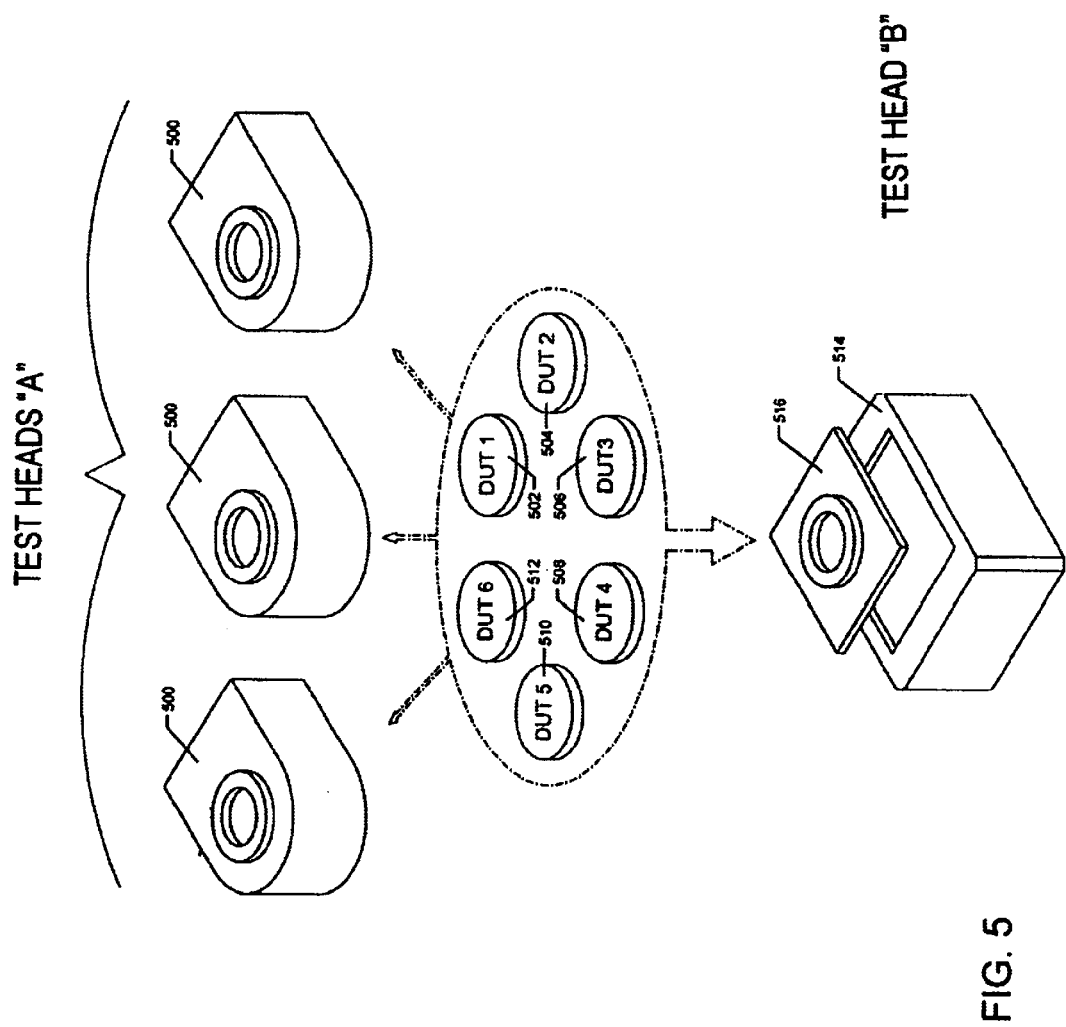
FIG. 5 is a block diagram illustrating a method of doing business with the interface adapter of the present invention.

The removable interface adapter of the present invention has many uses in business. Referring to FIG. 5, it is not uncommon for a manufacturer of integrated circuits and other electronic devices to make many types of devices and purchase a plurality of first test heads 500 from a single source in order to test the devices. A test board, or DUT board, must be made or purchased for each device type to be tested. Thus, for six parts DUT 1 . . . DUT 6, DUT boards 502, 504, 506, 508, 510 and 512 must be obtained. To test DUT 1, the DUT board 502 is secured to one of the first test heads 500. The DUT board 502 is removed after testing so that another type of device can be tested on that test head 500.

The manufacturer can purchase a test head 514 from a different source, but the test head 14 is not likely to be compatible with the DUT boards 502 . . . 512. However, by making or purchasing an interface adapter 516, as has been described, the DUT boards 502 . . . 512 can be used with the second test head 514. The interface adapter 516 is compatible with the second test head 514 on one side, and is compatible with the DUT boards 502 . . . 512 on the other side. Thus, the interface adapter 516 provides a competitive advantage to the manufacturer, because competition among test head providers is increased. The supplier of the test head 514 also obtains a competitive advantage, because its customer can more easily and less expensively purchase the different test head, even when the customer has already purchased several test heads from the competitor.

The many advantages of this invention are now apparent. Test boards designed for one test system can be used on different test systems. A user having several test systems with different test heads and multiple devices to test can easily test the devices on different test heads, without building a DUT board for each test system, as well as each device. Moreover, the user may buy test systems having different test heads, and test devices on the new test systems without building new DUT boards for each device. This allows the purchaser to purchase a competitive test system or less expensive test system, for example, which can result in considerable savings.

While the principles of the invention have been described above in connection with specific apparatus and applications, it is to be understood that this description is made only by way of example and not as a limitation on the scope of the invention.

What is claimed is:

1. A removable interface adapter for testing electrical devices in a test system having a test head, using a test board having a plurality of first electrical contacts in a first configuration, the test board having conductors connected to terminals of the electrical devices, the test head having a plurality of second electrical contacts in a second configuration, the interface adapter comprising:

a frame that can be secured to and removed from the test head, a first set of adapter contacts configured for connection to the first electrical contacts in the test board, and a second set of adapter contacts configured for connection to the second electrical contacts in the test head, the first and second adapter contacts being interconnected so that the devices in the test board can be tested by the test system.

2. The interface adapter of claim 1 wherein the first adapter contacts are spring loaded pins.

3. The interface adapter of claim 1 wherein the second adapter contacts are spring loaded pins.

4. The interface adapter of claim 1 wherein the frame of the interface adapter has cam followers, and the test head has movable cam surfaces for securing the frame to the test head.

5. The interface adapter of claim 1 wherein the test board has cam followers and the interface adapter has movable cam surfaces for securing the test board to the interface adapter.

6. The interface adapter of claim 1 in which the first configuration and the second configuration are different.

7. The interface adapter of claim 1 in which the first configuration and the second configuration are the same.

8. Apparatus for testing electronic devices comprising:

a test board that holds the electronic devices, the test board having conductors connected to terminals of the electrical devices, and a plurality of first electrical contacts arranged in a first array, a test head having a plurality of second electrical contacts arranged in a second array, testing circuits connected to the test head for testing the electrical devices, and a removable adapter having a first set of adapter contacts configured for connection to the first array, and a second set of adapter contacts configured for connection to the second array, the first and second adapter contacts being interconnected so that the devices in the test board can be tested by the testing circuits.

9. The apparatus of claim 8 in which the first array and the second array have different configurations.

10. The apparatus of claim 8 in which the first array and the second array have the same configurations.

11. The apparatus of claim 8 wherein the first set of adapter contacts are spring loaded pins.

12. The apparatus of claim 8 wherein the second adapter contacts are spring loaded pins.

13. The apparatus of claim 8 wherein the interface adapter has a frame, the frame having cam followers, and the test head has movable cam surfaces for securing the frame to the test head.

14. The apparatus of claim 8 wherein the test board has cam followers and the interface adapter has movable cam surfaces for securing the test board to the interface adapter base.

15. A method for testing a plurality of types of electronic devices comprising the steps of:

obtaining one or more first test heads;

obtaining a device under test (DUT) board for each of the types of devices to be tested on the first test heads, said DUT boards having conductors connected to terminals of the electrical devices;

obtaining a second test head, the DUT boards obtained for the first test heads being incompatible with the second test head;

obtaining a removable interface adapter that can be secured to the second test head, the DUT boards for the first test heads being compatible with the removable interface adapter; and testing devices using the second test head, the removable interface adapter, and the DUT boards obtained for use with the first test heads.

* * * * *